United States Patent
Lamb et al.

(10) Patent No.: US 7,039,148 B1
(45) Date of Patent: May 2, 2006

(54) PHASE DETECTOR AND SIGNAL LOCKING SYSTEM CONTROLLER

(75) Inventors: Jonathan Lamb, Ringwood (GB); Wolfgang Bruchner, Southampton (GB); Richard Lansdowne, Eastleigh (GB)

(73) Assignee: Semtech Corporation, Camarillo, CA (US)

( * ) Notice: Subject to any disclaimer, the term of this patent is extended or adjusted under 35 U.S.C. 154(b) by 749 days.

(21) Appl. No.: 09/921,797

(22) Filed: Aug. 2, 2001

Related U.S. Application Data

(60) Provisional application No. 60/287,229, filed on Apr. 27, 2001.

(51) Int. Cl.
*H03L 7/087* (2006.01)

(52) U.S. Cl. .......................... 375/375; 375/354; 326/93

(58) Field of Classification Search ................. 331/11, 331/17; 375/375, 376; 327/156; 342/422
See application file for complete search history.

(56) References Cited

U.S. PATENT DOCUMENTS

| | | | |
|---|---|---|---|
| 4,663,631 A * | 5/1987 | Brilman et al. ............. | 342/422 |
| 4,819,081 A | 4/1989 | Volk et al. ................... | 328/134 |
| 5,159,292 A | 10/1992 | Canfield et al. ............... | 331/1 |
| 5,883,533 A | 3/1999 | Matsuda et al. ............ | 327/156 |
| 5,905,388 A | 5/1999 | Van Der Valk et al. ..... | 327/107 |
| 5,970,110 A | 10/1999 | Li ............................... | 377/48 |
| 6,121,816 A | 9/2000 | Tonks et al. ................. | 327/296 |
| 6,198,355 B1 | 3/2001 | Lindquist et al. ............. | 331/27 |
| 6,229,864 B1 * | 5/2001 | DuFour ....................... | 375/375 |
| 6,304,116 B1 | 10/2001 | Yoon et al. .................. | 327/158 |
| 6,323,692 B1 | 11/2001 | Tsinker ......................... | 327/12 |
| 6,429,707 B1 | 8/2002 | Lamb et al. ................. | 327/159 |
| 6,483,389 B1 | 11/2002 | Lamb .......................... | 331/25 |
| 2001/0007436 A1 * | 7/2001 | Dosho et al. .................. | 331/11 |

* cited by examiner

*Primary Examiner*—Stephen Chin
*Assistant Examiner*—Jaison Joseph
(74) *Attorney, Agent, or Firm*—Thelen Reid & Priest L.L.P.; David B. Ritchie

(57) ABSTRACT

A phase detector and signal locking system controller for use in a digital phase-locked loop (PLL) application includes a first and a second phase detector where the first phase detector result is used to control the initial pull-in and the second phase detector is used to control fine tuning once the phase differences are too small for appropriate detection by the first phase detector. A post processing and control unit operates to effectively merge the two phase detector outputs and to apply the appropriate gain factor that can be used to control a PLL system.

52 Claims, 5 Drawing Sheets

PHASE DETECTOR AND SIGNAL LOCKING SYSTEM CONTROLLER

CROSS-REFRENCE TO RELATED APPLICATION

This application claims priority based on U.S. Provisional Patent Application Ser. No. 60/287,229 filed on Apr. 27, 2001.

FIELD OF THE INVENTON

This invention relates generally to a signal locking system controller and, more particularly, to a technique for controlling a digital phase-locked loop (PLL) for predictable modeling and dynamics.

BACKGROUND OF THE INVENTON

Signal locking systems typically rely on phase detectors in order to approximate the adjustment or gain factor to be applied to an output clock so as to coincide in time with an input reference signal clock. Typically, a phase difference between two clock sources of zero degrees is the design target in a standard phase-locked loop (PLL) system. PLL circuits can be implemented in either predominately digital or analog fashion, where the primary difference is in the way the output clock function is constructed. The analog PLL may, for example, employ a voltage-controlled oscillator (VCO), while a digital PLL may employ a digital accumulator circuit where the most significant bit (MSB) is typically used to form the output clock. In typical digital PLL circuits, the phase difference measurements are often limited by the frequency of the digital system clock. For example, where the digital system clock is running at a frequency of 200 MHz, the phase difference measurement resolution is only 5 ns, or the period of the system clock. Thus, the minimum PLL system output jitter and wander, which are essentially system error factors, would also be 5 ns in this example case.

FIG. 1 shows a type of phase detector, indicated by the general reference character 100, that is capable of very good phase resolution. INPUT 1 signal 104 connects to the D-input of D-type flip-flop (DFF) 102. INPUT 2 signal 106 connects to the clk-input of the DFF and the output 108 connects to the Q-output of the DFF. One of INPUT 1 or INPUT 2 may represent a feedback clock and the other a reference clock in a PLL system, for example. This circuit indicates the order of the signals based on the first transition edge (i.e., low-to-high or rising transition). The output 108 goes low if the INPUT 1 rising edge occurs after the INPUT 2 rising edge, but the output goes high if the INPUT 1 rising edge occurs prior to the INPUT 2 rising edge. This phase detection approach has the advantage of infinitesimally small timing resolution, but the disadvantage is that the gain, or the ratio of the increase in oscillator output frequency to the input phase difference, is very high and, as such, is very difficult to control.

The PLL system application requires a defined measurement of the input phase difference in order for the system to subsequently have a defined gain, bandwidth, and damping factor. The bandwidth is essentially the frequency range over which the PLL system allows stable operation. The damping factor indicates how well a system is damped and, as it follows, how much ringing is produced after an input signal disturbance. Common digital phase measurement techniques, such as those employing the standard type 4 phase and frequency detector circuit are able to indicate the relative phase difference of two signals, but this approach is limited by the system clock and its general digital nature. As such, the resolution is insufficient to avoid excessive output jitter and wander in the phase-locked position, as described above. For the phase detector shown in FIG. 1, superior timing resolution is achieved, but the gain of this detector is not controllable and, thus, the associated PLL system dynamics of bandwidth and damping factor would also be uncontrollable.

As described, common phase detection approaches, particularly those used in digital-based signal locking systems like digital PLLs, typically suffer from either insufficient phase difference resolution for the application or uncontrollable gain.

It would be desirable to arrive at some way of providing phase difference information and control that would enable very high input phase difference resolution along with controllable PLL dynamics in an implementation that would remain reliable over the expected operating conditions and process variations.

SUMMARY OF THE INVENTION

A phase detector and a signal locking system controller, suitable for digital PLL systems, includes two different types of phase detectors, a synchronizing circuit, and a post processing and control unit. The first phase detector may be a common type 4 phase and frequency detector that is well known in the art. The first phase detector receives two input sources and outputs two phase indicator signals. The phase indicator signals couple to the synchronizing circuit along with a system clock and the synchronizing circuit outputs two synchronized phase indicator signals. The second phase detector also receives the two input sources and it generates an order indicator signal. The post processing and control unit receives the synchronized phase indicator signals, the order indicator signal, and an input source, and it outputs a phase measurement result signal. The post processing and control unit includes various circuits that allow for the system to use the information from the phase detectors and to apply a first gain factor when the input phase difference is relatively large and to apply a second gain factor when the input phase difference is relatively small. The first phase detector provides the phase difference information and enables control when the input sources are relatively far apart in phase and the second phase detector provides the signal order information and enables control when the input sources are relatively close in phase.

An advantage of the present invention is that it provides accurate and effective gain control and, as a result, also provides reliable modeling and system behavior.

Another advantage of the present invention is that the system performance is largely independent of variations in operating temperature, supply voltage, or manufacturing process because of the digital nature of the design.

Another advantage of the present invention is that it allows for very fine input phase difference resolution as it is able to resolve time differences much less than the period of the system clock of the digital logic.

Yet another advantage of the present invention is that the post processing and control unit disallows conflict between the two types of phase detectors and this prevents deadbands during the switching between control based on one phase detector to control based on the other.

BRIEF DESCRIPTION OF THE DRAWINGS

The accompanying drawings, which are incorporated in and constitute a part of this specification, illustrate one or more embodiments of the invention and, together with the present description, serve to explain the principles of the invention.

In the drawings.

DETAILED DESCRIPTION OF SPECIFIC EMBODIMENTS OF THE INVENTION

A specific embodiment of the present invention is described herein in the context of a digital PLL system. Those of ordinary skill in the art will realize that the following description of the present invention is illustrative only and is not intended to be in any way limiting. Other embodiments of the invention will readily suggest themselves to such skilled persons having the benefit of this disclosure. Reference will now be made in detail to an implementation of the present invention as illustrated in the accompanying drawings.

In the interest of clarity, not all of the routine features of the implementations herein are described. It will of course be appreciated that in the development of any such actual implementation, numerous implementation-specific decisions must be made to achieve the developers' specific goals, such as compliance with system- and business-related constraints, and that these goals will vary from one implementation to another. Moreover, it will be appreciated that such a development effort might be complex and time-consuming, but would nevertheless be a routine undertaking of engineering for those of ordinary skill in the art having the benefit of this disclosure.

Figure 1:
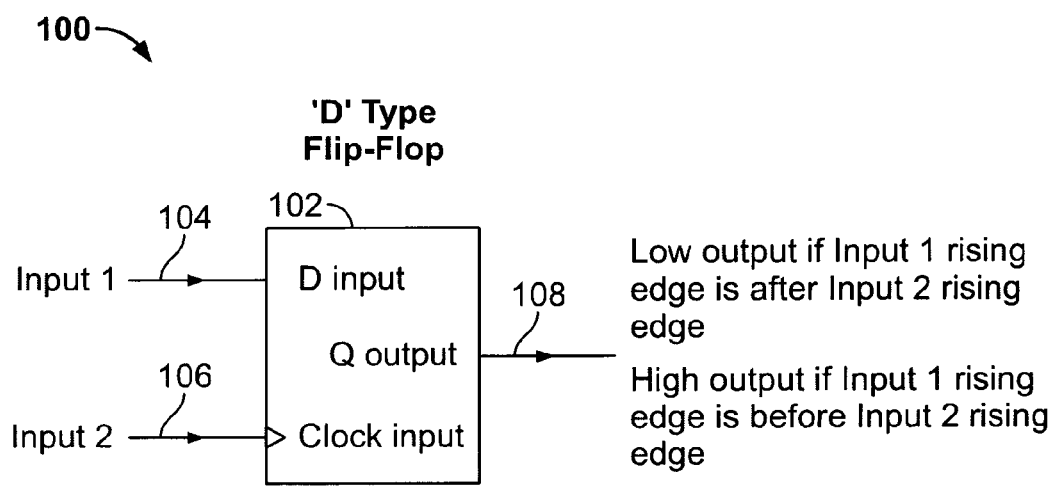
FIG. 1 is a schematic functional block diagram illustrative of a phase detector configuration in accordance with the prior art.
Figure 2:
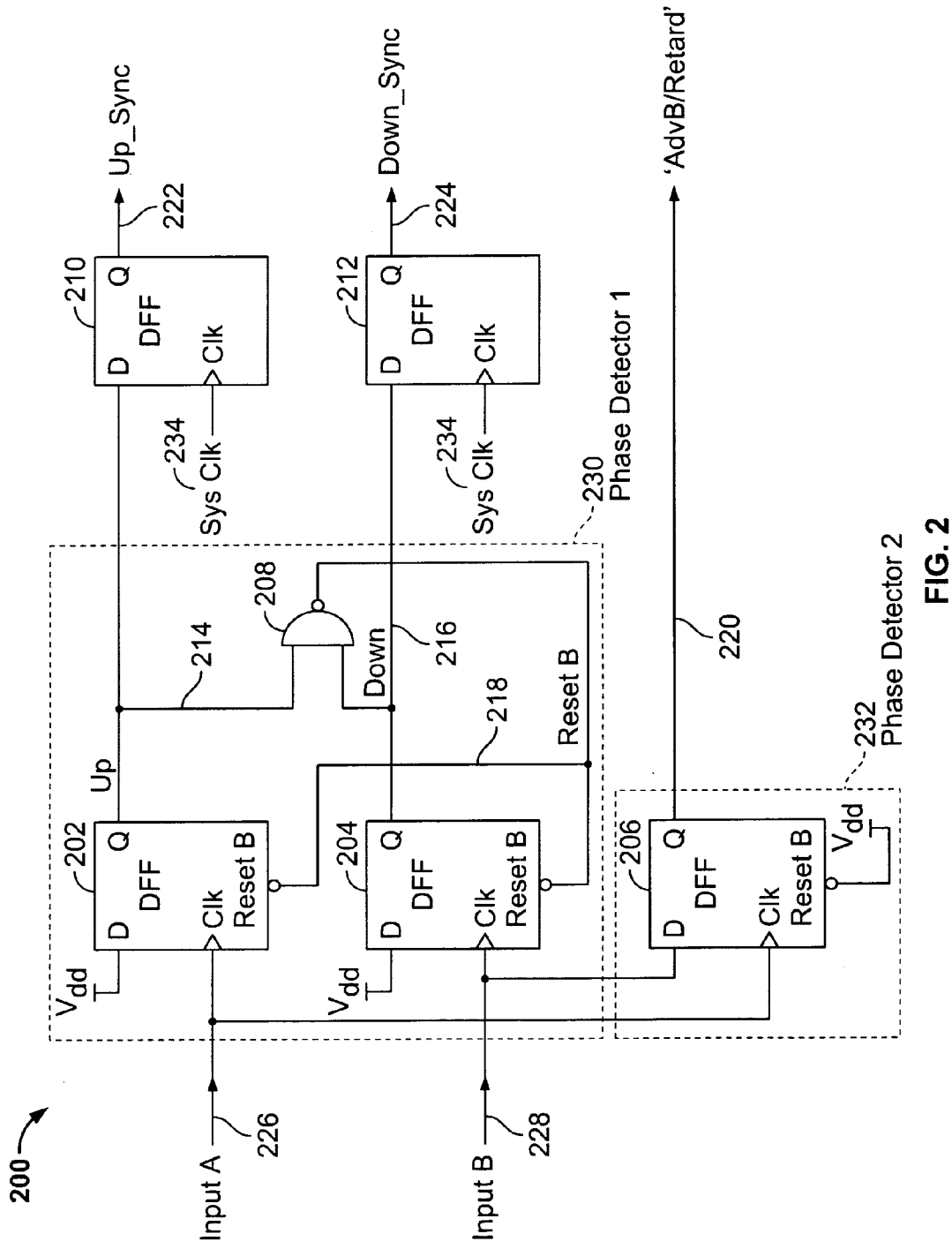
FIG. 2 is a schematic functional block diagram of a first portion of a specific embodiment of the present invention.

FIG. 2 shows a schematic functional block diagram of a first portion of a specific embodiment of the present invention in the system indicated by the general reference character 200. This first portion can include two different types of phase detectors and a synchronizing circuit. The first phase detector 230 can include D-type flip-flop (DFF) 202, DFF 204, and NAND-gate 208. The second phase detector 232 can include DFF 206. The synchronizing circuit can include DFFs 210 and 212. Flip flops 202, 204 and 206 use an asynchronous reset structure.

The positive voltage supply, VDD, can connect to the D-inputs of DFFs 202 and 204 and also to the reset-input of DFF 206. The first input source 226, INPUT A, can connect to the clk-inputs of DFFs 202 and 206. The second input source 228, INPUT B, can connect to the clk-input of DFF 204 and also to the D-input of DFF 206. The first phase indicator signal 214, UP, can connect to the Q-output of DFF 202, to the first input of NAND-gate 208, and to the D-input of DFF 210. The second phase indicator signal 216, DOWN, can connect to the Q-output of DFF 204, to the second input of NAND-gate 208, and to the D-input of DFF 212. The active-low reset control signal 218, RESETB, can connect to the reset-inputs of DFFs 202 and 204. The system clock signal 234, SYS CLK, can connect to the clk-inputs of DFFs 210 and 212. The first synchronized phase indicator signal 222, UP_SYNC, can connect to the Q-output of DFF 210 and the second synchronized phase indicator signal 224, DOWN_SYNC, can connect to the Q-output of DFF 212. The order indicator signal 220, ADVB/RETARD, can connect to the Q-output of DFF 206. Those of ordinary skill in the art will now realize that other logic structures can be built to achieve the same function as that described for first phase detector 230 and second phase detector 232.

Figure 3:
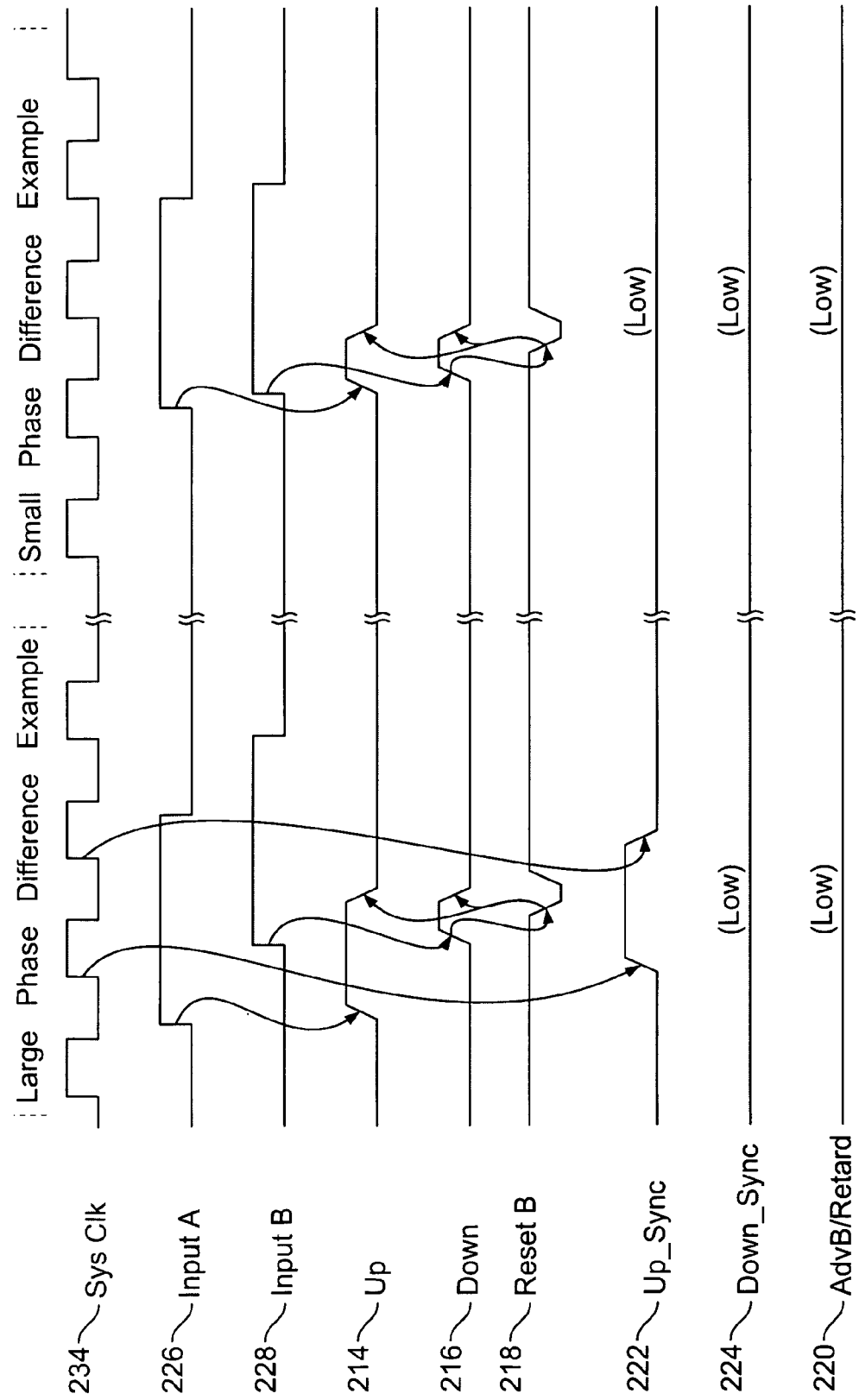
FIG. 3 is a timing diagram illustrative of the operation of a first portion of a specific embodiment of the present invention.

Referring now to the timing diagram of FIG. 3 and viewing this diagram in conjunction with FIG. 2, the operation of the circuit will be described by way of example.

In the example, the first section of the timing diagram (the left half of the figure) shows an example case for a first operational mode of the controller where the input sources differ by a relatively large amount. This amount can typically be greater than the system clock signal (SYS CLK) period, but the circuit may detect this difference as relatively large in some cases when the difference is less that a SYS CLK period. In the first section, the first input source (INPUT A) is shown leading the second input source (INPUT B). Upon detection of the rising edge of INPUT A, the first phase indicator signal (UP) can go high (i.e., active). Upon detection of the rising edge of INPUT B, the second phase indicator signal (DOWN) can go high. The NAND-gate discharges the reset control signal (RESETB) and this can reset DFFs 202 and 204, subsequently causing UP and DOWN to discharge (i.e., deactivate). It should be noted that the implementation may include additional delay to the RESETB signal in order to allow enough time to ensure the proper resetting of registers 202 and 204. The first synchronized phase indicator signal (UP_SYNC) can become active upon the SYS CLK rising (i.e., first transition) edge while UP is high. The second synchronized phase indicator signal (DOWN_SYNC) can remain in a low state because DOWN was not high upon a SYS CLK rising edge. Thus, the synchronizing circuit was not able to detect the second phase indicator signal as active. The UP_SYNC can indicate that INPUT A leads INPUT B by an amount proportional to the high time of the first synchronized phase indicator signal. The order indicator signal (ADVB/RETARD) can remain low because DFF 206 can detect INPUT B as low upon the rising edge of INPUT A.

The second section of the timing diagram (the right half of the figure) shows an example case for a second operational mode of the controller where INPUT A leads INPUT B by only a very small amount, as related to the SYS CLK period. Again, UP can go high upon the rising edge of INPUT A and DOWN can, similarly, go high upon the rising edge of INPUT B. The RESETB signal can subsequently go low to activate the resetting mechanism of registers 202 and 204, and this can discharge both UP and DOWN. Because neither UP nor DOWN are active upon a rising edge of SYS CLK, UP_SYNC and DOWN_SYNC can remain low, indicating that the synchronizing circuit has not detected an active phase indicator signal. Again, ADVB/RETARD can remain low because DFF 206 can detect INPUT B as low upon the rising edge of INPUT A.

Figure 4:
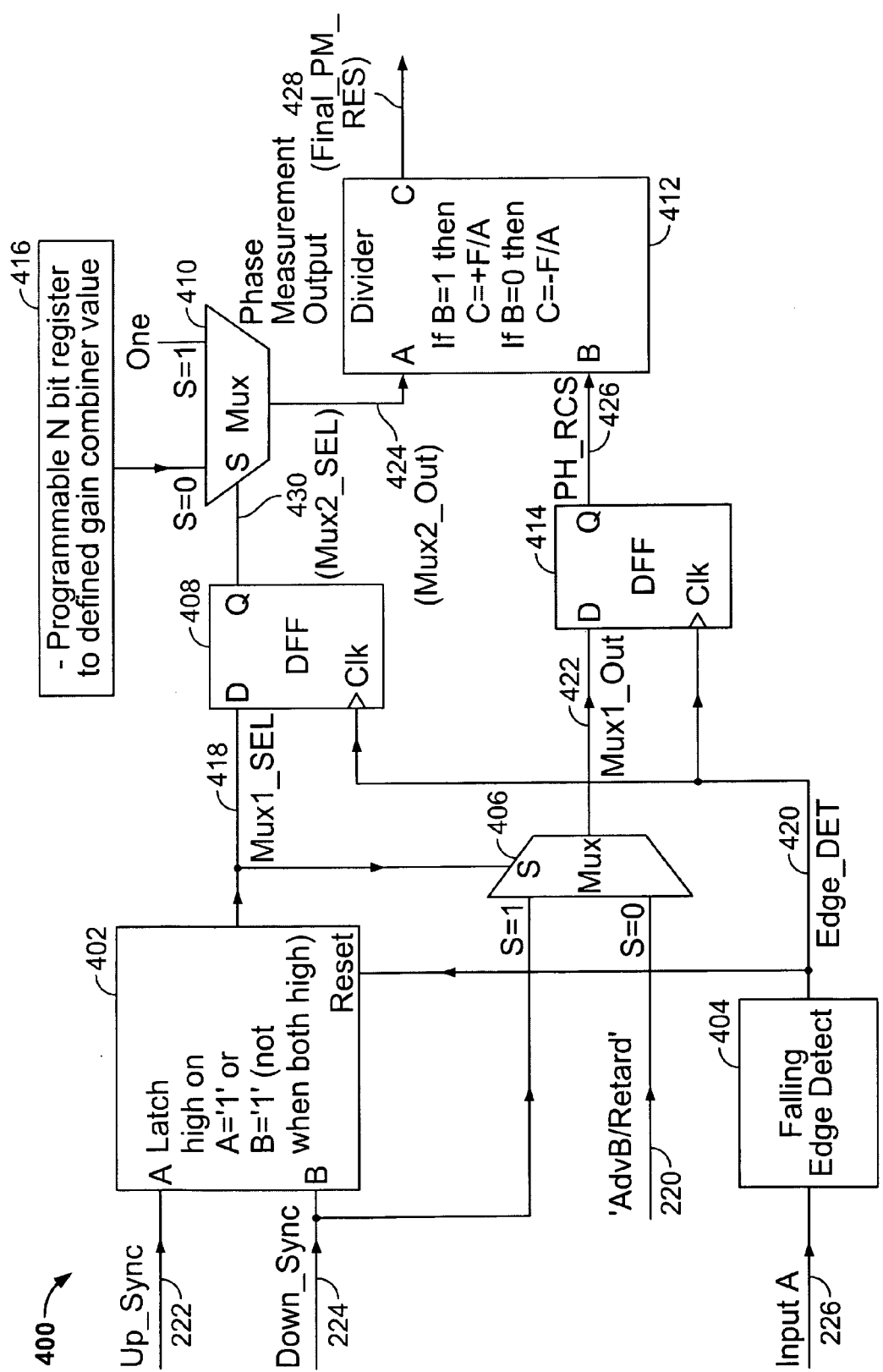
FIG. 4 is a schematic functional block diagram of a second portion of a specific embodiment of the present invention.

FIG. 4 shows a schematic functional block diagram of a second portion of a specific embodiment of the present invention in the system indicated by the general reference character 400. This second portion can include a synchronous signal latch 402, a first multiplexer 406, an edge detection block 404, a first register (DFF) 408, a second register (DFF) 414, a programmable storage unit 416, a second multiplexer 410, and a divider 412.

The first synchronized phase indicator signal 222, UP_SYNC, can connect to the A-input of the synchronous signal latch 402. The second synchronized phase indicator signal 224, DOWN_SYNC, can connect to the B-input of the synchronous signal latch and also to the second input of the first multiplexer 406. The order indicator signal 220, ADVB/RETARD, can connect to the first input of the first multiplexer. The first input source 226, INPUT A, can connect to the input of the edge detection block 404. The edge detection control signal 420, EDGE_DET, can connect to the output of the edge detection block, to the reset-input of the synchronous signal latch, and to the clk-inputs of DFFs 408 and 414. The first multiplexer selection control signal 418, MUX1_SEL, can connect to the output of the synchronous signal latch, to the selection input of the first multiplexer 406 and also to the D-input of DFF 408. The first multiplexer output signal 422, MUX1_OUT, can connect to the D-input of DFF 414. The second multiplexer selection control signal 430, MUX2_SEL, can connect to the Q-output of DFF 408 and to the selection input of the second multiplexer 410. The programmable storage unit 416 output can couple to the first input of the second multiplexer and a default gain value can couple to the second input of the second multiplexer. The second multiplexer output signal 424, MUX2_OUT, can connect to the A-input of divider 412. The phase result indicator signal 426, PH_RES, can connect to the Q-output of DFF 414 and also to the B-input of divider 412. The phase measurement result signal 428, FINAL_PM_RES, can connect to the C-output of the divider.

Figure 5:
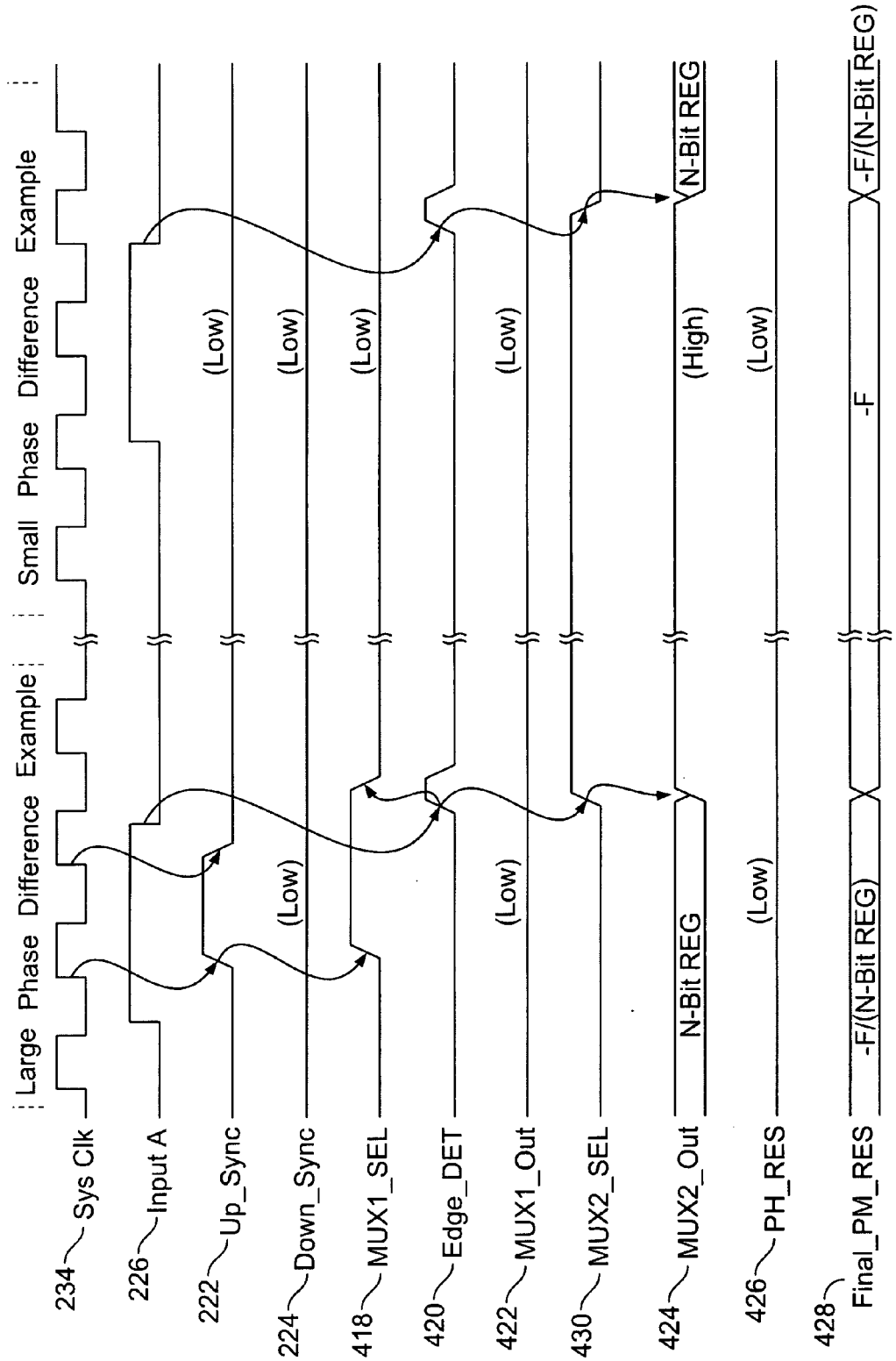
FIG. 5 is a timing diagram illustrative of the operation of the second portion of a specific embodiment of the present invention.

Referring now to the timing diagram of FIG. 5 and viewing this diagram in conjunction with FIG. 4, the operation of the circuit will be described by way of continuing the example above. In FIG. 5, the system clock signal (SYS CLK), the first input source (INPUT A), the first synchronized phase indicator signal (UP_SYNC), and the second synchronized phase indicator signal (DOWN_SYNC) are all carried over from the example case illustrated in FIG. 3.

In FIG. 5, the first section of the timing diagram (the left half of the figure) continues the example case for a first operational mode of the controller where the input sources differ by a relatively large amount.

The first multiplexer selection control signal (MUX1_SEL) can go high upon the rising edge of UP_SYNC by the action of the synchronous signal latch 402. The edge detection control signal (EDGE_DET) can go high upon the second transition (i.e., falling) edge of the first input source (INPUT A). EDGE_DET can then reset MUX1_SEL and also bring the second multiplexer selection control signal (MUX2_SEL) high upon its rising edge through the DFF 408 operation. The first multiplexer output signal (MUX1_OUT) can remain low because ADVB/RETARD is low while MUX1_SEL is low and DOWN_SYNC is low while MUX1_SEL is high. The second multiplexer output signal (MUX2_OUT) can switch to the default gain value (logic high) upon MUX2_SEL going high. The phase result indicator signal (PH_RES) can remain low because MUX1_OUT remains low. The phase measurement result signal (FINAL_PM_RES) can switch to the "-F" value because the B-input of the divider 412 (PH_RES) is low and the A-input of the divider is "1" (i.e., logic high level). This represents the coarse control needed by the overall PLL system as part of the first operational mode of the controller.

The second section of the timing diagram (the right half of FIG. 5) continues the example case for a second operational mode of the controller where INPUT A leads INPUT B by only a very small amount, as related to the SYS CLK period.

UP_SYNC can remain low because the first phase indicator signal is not recognized by the synchronizing circuit. Similarly, and as described above, DOWN_SYNC can also remain low. MUX1_SEL can remain low because the synchronous signal latch 402 can detect UP_SYNC and DOWN_SYNC as both low. The edge detection block 404 can produce a high on EDGE_DET upon the falling edge of INPUT A. MUX1_OUT can remain low because ADVB/RETARD is low and MUX1_SEL is low. MUX2_OUT can switch to the gain combiner value (i.e., N-bit register value) upon MUX2_SEL going low. The phase result indicator signal (PH_RES) can remain low because MUX1_OUT remains low. The phase measurement result signal (FINAL_PM_RES) can switch to the "-F/(N-BIT REG)" value because the B-input of the divider 412 (PH_RES) is low and the A-input of the divider is the gain combiner value, "N-BIT REG". This represents the more fine tuning control needed by the overall PLL system as part of the second operational mode of the controller.

The example shows only two input sources, but as it is clear to one skilled in the art, more than two signals, with or without additional phase detector implementations, could be included in the system. Also, while the example described input sources with the same frequency, the source signals could also differ in frequency. The nature and implementation of the phase measurement result signal could also be altered to accommodate different system applications.

The coupling of certain signals to certain functional blocks could also be altered without changing the scope of the invention. For example, in FIG. 4, the first synchronized phase indicator signal instead of the second synchronized phase indicator signal might be coupled to the first multiplexer. Or, the second input source instead of the first input source might be coupled to the edge detection block. Also, many of the components described are representative of the various functional blocks that may be part of a given implementation; however, other implementations using different functional block representations could also be realized by those of ordinary skill in the art.

While embodiments and applications of this invention have been shown and described, it would be apparent to those of ordinary skill in the art having the benefit of this disclosure that many more modifications than mentioned above are possible without departing from the inventive concepts herein. The invention, therefore, is not to be restricted except in the spirit of the appended claims.

What is claimed is:

1. A phase detector and signal locking system controller comprising:
    a first phase detector receiving at least a first input source and a second input source and outputting at least a first control signal;
    a second phase detector receiving at least the first input source and the second input source and outputting at least a second control signal; and
    a control unit receiving at least the first control signal, the second control signal, a first gain factor, and a second gain factor and outputting at least a phase measurement result signal.

2. The phase detector and signal locking system controller of claim 1 wherein:

a first operational mode includes the first control signal enabling the application of the first gain factor to the phase measurement result signal; and a second operational mode includes the second control signal enabling the application of the second gain factor to the phase measurement result signal.

3. A phase detector and signal locking system controller comprising:

a first phase detector receiving at least a first input source and a second input source and outputting at least a first phase indicator signal and a second phase indicator signal;

a second phase detector receiving at least the first input source and the second input source and outputting at least an order indicator signal;

a synchronizing circuit receiving at least the first phase indicator signal, the second phase indicator signal, and a system clock signal and outputting at least a first synchronized phase indicator signal and a second synchronized phase indicator signal; and a post processing and control unit receiving at least the first synchronized phase indicator signal, the second synchronized phase indicator signal, the order indicator signal and the first input source and outputting a phase measurement result signal.

4. The phase detector and signal locking system controller of claim 3 wherein:

the first phase detector includes a first register, a second register, and a NAND-gate circuit.

5. The phase detector and signal locking system controller of claim 4 wherein:

the first register receives at least the first input source and a reset control signal and outputs at least the first phase indicator signal;

the second register receives at least the second input source and the reset control signal and outputs at least the second phase indicator signal; and the NAND-gate circuit receives at least the first phase indicator signal and the second phase indicator signal and outputs at least the reset control signal.

6. The phase detector and signal locking system controller of claim 5 wherein:

the first register includes a D-type flip-flop (DFF) circuit having a clk-input, a reset-input, and a Q-output;

the first input source is coupled to at least the clk-input of the DFF circuit;

the reset control signal is coupled to at least the reset-input of the DFF circuit; and the first phase indicator signal is coupled to at least the Q-output of the DFF circuit.

7. The phase detector and signal locking system controller of claim 5 wherein:

the second register includes a D-type flip-flop (DFF) circuit having a clk-input, a reset-input, and a Q-output;

the second input source is coupled to at least the clk-input of the DFF circuit;

the reset control signal is coupled to at least the reset-input of the DFF circuit; and the second phase indicator signal is coupled to at least the Q-output of the DFF circuit.

8. The phase detector and signal locking system controller of claim 3 wherein:

the second phase detector includes a register.

9. The phase detector and signal locking system controller of claim 8 wherein:

the register includes a D-type flip-flop (DFF) circuit having a clk-input, a D-input, and a Q-output;

the first input source is coupled to at least the clk-input of the DFF circuit;

the second input source is coupled to at least the D-input of the DFF circuit; and the order indicator signal is coupled to at least the Q-output of the DFF circuit.

10. The phase detector and signal locking system controller of claim 3 wherein:

the synchronizing circuit includes a first register and a second register.

11. The phase detector and signal locking system controller of claim 10 wherein:

the first register includes a D-type flip-flop (DFF) circuit having a D-input, a clk-input and a Q-output;

the first phase indicator signal is coupled to at least the D-input of the DFF circuit;

the system clock signal is coupled to at least the clk-input of the DFF circuit; and the first synchronized phase indicator signal is coupled to at least the Q-output of the DFF circuit.

12. The phase detector and signal locking system controller of claim 10 wherein:

the second register includes a D-type flip-flop (DFF) circuit having a D-input, a clk-input, and a Q-output;

the second phase indicator signal is coupled to at least the D-input of the DFF circuit;

the system clock signal is coupled to at least the clk-input of the DFF circuit; and the second synchronized phase indicator signal is coupled to at least the Q-output of the DFF circuit.

13. The phase detector and signal locking system controller of claim 3 wherein:

the first phase indicator signal is activated upon detection of a first transition edge of the first input source.

14. The phase detector and signal locking system controller of claim 3 wherein:

the second phase indicator signal is activated upon detection of a first transition edge of the second input source.

15. The phase detector and signal locking system controller of claim 3 wherein:

the order indicator signal is activated upon detection of a first transition edge of the second input source occurring prior to the first transition edge of the first input source.

16. The phase detector and signal locking system controller of claim 3 wherein:

the order indicator signal is activated upon detection of the beginning of the period of the second input source occurring prior to the beginning of the period of the first input source.

17. The phase detector and signal locking system controller of claim 3 wherein:

the first synchronized phase indicator signal is activated upon detection of:

a first transition edge of the system clock signal; and the first phase indicator signal in an active state.

18. The phase detector and signal locking system controller of claim 3 wherein:

the second synchronized phase indicator signal is activated upon detection of:

a first transition edge of the system clock signal; and the second phase indicator signal in an active state.

19. The phase detector and signal locking system controller of claim 3 wherein the post processing and control unit includes:

a synchronous signal latch receiving at least the first synchronized phase indicator, the second synchronized phase indicator signal, and an edge detection control signal and outputting a first multiplexer selection control signal;

a first multiplexer receiving at least the second synchronized phase indicator signal, the order indicator signal, and the first multiplexer selection control signal and outputting a first multiplexer output signal;

an edge detection block receiving at least the first input source and outputting at least the edge detection control signal;

a first register receiving at least the first multiplexer selection control signal and the edge detection control signal and outputting at least the second multiplexer selection control signal;

a second register receiving at least the first multiplexer output signal and the edge detection control signal and outputting at least a phase result indicator signal;

a programmable storage unit outputting at least a gain combiner value;

a second multiplexer receiving at least the gain combiner value, the second multiplexer selection control signal, and a default gain value and outputting at least a second multiplexer output signal; and a divider receiving at least the second multiplexer output signal and the phase result indicator signal and outputting at least the phase measurement result signal.

20. The phase detector and signal locking system controller of claim 19 wherein:

the edge detection control signal is activated upon detection of the second transition edge of the first input source.

21. The phase detector and signal locking system controller of claim 19 wherein:

the first multiplexer selection control signal is activated upon detection of:

the first transition edge of the first synchronized phase indicator signal while the second synchronized phase indicator signal is in an inactive state; or the first transition edge of the second synchronized phase indicator signal while the first synchronized phase indicator signal is in the inactive state.

22. The phase detector and signal locking system controller of claim 19 wherein:

the first multiplexer selection control signal is deactivated upon detection of the edge detection control signal in an active state.

23. The phase detector and signal locking system controller of claim 19 wherein:

the first multiplexer includes a mux circuit having a first input, a second input, a selection input, and an output, and operating to provide the first input to the output when the selection input is in an inactive state and operating to provide the second input to the output when the selection input is in an active state;

the second synchronized phase indicator signal is coupled to at least the second input of the mux circuit;

the order indicator signal is coupled to at least the first input of the mux circuit;

the first multiplexer selection control signal is coupled to at least the selection input of the mux circuit; and the first multiplexer output signal is coupled to at least the output of the mux circuit.

24. The phase detector and signal locking system controller of claim 19 wherein:

the first register includes a D-type flip-flop (DFF) circuit having a D-input, a clk-input, and a Q-output;

the first multiplexer selection control signal is coupled to at least the D-input of the DFF circuit;

the edge detection control signal is coupled to at least the clk-input of the DFF circuit; and the second multiplexer selection control signal is coupled to at least the Q-output of the DFF circuit.

25. The phase detector and signal locking system controller of claim 19 wherein:

the second register includes a D-type flip-flop (DFF) circuit having a D-input, a clk-input, and a Q-output;

the first multiplexer output signal is coupled to at least the D-input of the DFF circuit; and the edge detection control signal is coupled to at least the clk-input of the DFF circuit.

26. The phase detector and signal locking system controller of claim 19 wherein:

the second multiplexer selection control signal is activated upon detection of:

a first transition edge of the edge detection control signal; and the first multiplexer selection control signal in an active state.

27. The phase detector and signal locking system controller of claim 19 wherein:

the phase result indicator signal is activated upon detection of:

a first transition edge of the edge detection control signal; and the first multiplexer output signal in an active state.

28. The phase detector and signal locking system controller of claim 19 wherein:

the second multiplexer includes a mux circuit having a first input, a second input, a selection input, and an output, and operating to provide the first input to the output when the selection input is in an inactive state and operating to provide the second input to the output when the selection input is in an active state;

the default gain value is coupled to at least the first input of the mux circuit;

the gain combiner value is coupled to at least the second input of the mux circuit;

the second multiplexer selection signal is coupled to at least the selection input of the mux circuit; and the second multiplexer output signal is coupled to at least the output of the mux circuit.

29. The phase detector and signal locking system controller of claim 19 wherein:

the divider includes a divider function circuit having an A-input, a B-input, and a C-output, and operating to provide to the C-output a positive fixed number value divided by the A-input value when the B-input is in an active state and operating to provide to the C-output a negative fixed number value divided by the A-input value when the B-input is in an inactive state;

the second multiplexer output signal is coupled to at least the A-input of the divider function circuit;

the phase result indicator signal is coupled to at least the B-input of the divider function circuit; and the phase measurement result signal is coupled to at least the C-output of the divider function circuit.

30. The phase detector and signal locking system controller of claim 29 wherein:

the positive fixed number value and the negative fixed number value have the same absolute value.

31. The phase detector and signal locking system controller of claims 13, 14, 15, 17, 18, 21, 26, or 27 wherein:

the first transition edge is the low-to-high signal transition.

32. The phase detector and signal locking system controller of claim 20 wherein:
the second transition edge is the high-to-low signal transition.

33. The phase detector and signal locking system controller of claims 17, 18, 22, 23, 26, 27, 28, or 29 wherein:
the active state is the logic high state.

34. The phase detector and signal locking system controller of claims 21, 23, 28, or 29 wherein:
the inactive state is the logic low state.

35. A means for controlling a signal locking system comprising:
a means for generating a phase measurement result signal by:
applying a first gain factor during a first operational mode controlled by a first phase detector; and
applying a second gain factor during a second operational mode controlled by a second phase detector.

36. A means for controlling a signal locking system comprising:
a means for generating a first phase indicator signal from a first transition edge of a first input source;
a means for generating a second phase indicator signal from the first transition edge of a second input source;
a means for generating a first synchronized phase indicator signal from the first transition edge of a system clock signal and based on the first phase indicator signal in an active state;
a means for generating a second synchronized phase indicator signal from the first transition edge of the system clock signal and based on the second phase indicator signal in an active state;
a means for generating an order indicator signal; and
a means for generating a phase measurement result signal.

37. The means for controlling a signal locking system of claim 36 wherein:
the means for generating the order indicator signal includes means for detecting the first transition edge of the second input source relative to the first transition edge of the first input source.

38. The means for controlling a signal locking system of claim 36 wherein:
the means for generating the phase measurement result signal includes:
means for generating an edge detection control signal based on the second transition edge of the first input source;
means for generating a mode selection result;
means for selecting between the order indicator signal and the second synchronized phase indictor signal based on the mode selection result;
means for generating a gain combiner value and a default gain value;
means for generating a value selection result by selecting between the gain combiner value and the default gain value and based on the mode selection result;
means for generating a phase result indicator signal based on the mode selection result; and
means for applying a divider function to the value selection result based on the phase result indicator signal.

39. The means for controlling a signal locking system of claim 38 wherein:
the means for generating the mode selection result includes:
detection of the first synchronized phase indicator signal in an active state while the second synchronized phase indicator signal is in an inactive state or detection of the second synchronized phase indicator signal in an active state while the first synchronized phase indicator signal is in an inactive state; and
resetting upon detection of the edge detection control signal in an active state.

40. The means for controlling a signal locking system of claims 36 or 37 wherein:
the first transition edge is the low-to-high signal transition.

41. The means for controlling a signal locking system of claim 38 wherein:
the second transition edge is the high-to-low signal transition.

42. The means for controlling a signal locking system of claims 36 or 39 wherein:
the active state is the logic high state.

43. The means for controlling a signal locking system of claim 39 wherein:
the inactive state is the logic low state.

44. A method of controlling a signal locking system comprising the steps of:
generating a phase measurement result signal by:
applying a first gain factor during a first operational mode controlled by a first phase detector; and
applying a second gain factor during a second operational mode controlled by a second phase detector.

45. A method of controlling a signal locking system comprising the steps of:
generating a first phase indicator signal from a first transition edge of a first input source;
generating a second phase indicator signal from the first transition edge of a second input source;
generating a first synchronized phase indicator signal from the first transition edge of a system clock signal and based on the first phase indicator signal in an active state;
generating a second synchronized phase indicator signal from the first transition edge of the system clock signal and based on the second phase indicator signal in an active state;
generating an order indicator signal; and
generating a phase measurement result signal.

46. The method of controlling a signal locking system of claim 45, further comprising the step of:
generating the order indicator signal by detecting the first transition edge of the second input source relative to the first transition edge of the first input source.

47. The method of controlling a signal locking system of claim 45 wherein the step of generating the phase measurement result signal further comprises the steps of:
generating an edge detection control signal based on the second transition edge of the first input source;
generating a mode selection result;
selecting between the order indicator signal and the second synchronized phase indictor signal based on the mode selection result;
generating a gain combiner value and a default gain value;
generating a value selection result by selecting between the gain combiner value and the default gain value and based on the mode selection result;
generating a phase result indicator signal based on the mode selection result; and applying a divider function to the value selection result based on the phase result indicator signal.

48. The method of controlling a signal locking system of claim 47 wherein the step of generating the mode selection result further comprises the steps of:
   detecting the first synchronized phase indicator signal in an active state while the second synchronized phase indicator signal is in an inactive state or detecting the second synchronized phase indicator signal in an active state while the first synchronized phase indicator signal is in an inactive state; and
   resetting upon detection of the edge detection control signal in an active state.

49. The method of controlling a signal locking system of claims 45 or 46 wherein:
   the first transition edge is the low-to-high signal transition.

50. The method of controlling a signal locking system of claim 47 wherein:
   the second transition edge is the high-to-low signal transition.

51. The method of controlling a signal locking system of claims 45 or 48 wherein:
   the active state is the logic high state.

52. The method of controlling a signal locking system of claim 48 wherein:
   the inactive state is the logic low state.

* * * * *